(12) United States Patent
Lahoda

(10) Patent No.: US 10,899,671 B2
(45) Date of Patent: Jan. 26, 2021

(54) PROCESS FOR MANUFACTURING SIC COMPOSITE CERAMICS

(71) Applicant: WESTINGHOUSE ELECTRIC COMPANY LLC, Cranberry Township, PA (US)

(72) Inventor: Edward J. Lahoda, Edgewood, PA (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 159 days.

(21) Appl. No.: 15/245,933

(22) Filed: Aug. 24, 2016

(65) Prior Publication Data

US 2018/0057413 A1  Mar. 1, 2018

(51) Int. Cl.
| | | |
|---|---|---|
| *C23C 16/22* | (2006.01) | |
| *C04B 35/622* | (2006.01) | |
| *C23C 16/32* | (2006.01) | |
| *C04B 35/64* | (2006.01) | |
| *B32B 18/00* | (2006.01) | |

(Continued)

(52) U.S. Cl.
CPC ........ *C04B 35/62222* (2013.01); *B32B 18/00* (2013.01); *C04B 35/565* (2013.01); *C04B 35/62868* (2013.01); *C04B 35/62873* (2013.01); *C04B 35/64* (2013.01); *C04B 35/806* (2013.01); *C23C 16/045* (2013.01); *C23C 16/22* (2013.01); *C23C 16/325* (2013.01); *C04B 2235/46* (2013.01); *C04B 2235/5244* (2013.01); *C04B 2235/6028* (2013.01); *C04B 2235/614* (2013.01); *C04B 2235/661* (2013.01); *C04B 2235/667* (2013.01); *C04B 2235/77* (2013.01); *C04B 2235/94* (2013.01);

(Continued)

(58) Field of Classification Search
CPC .................................................... C23C 16/045
See application file for complete search history.

(56) References Cited

U.S. PATENT DOCUMENTS 3,427,222 A    2/1969  Biancheria et al.
4,980,202 A *  12/1990 Brennan ............... C04B 35/571
                                              427/249.15

(Continued)

OTHER PUBLICATIONS

Naslain, R. Two-dimensional SiC/SiC composites processed according to the isobaric-isothermal chemical vapor infiltration gas phase route. Journal or alloys and compounds, 188 (1992) 42-48 JACOM 9006 (Year: 1992).*

(Continued)

*Primary Examiner* — David P Turocy
(74) *Attorney, Agent, or Firm* — K&L Gates LLP

(57) ABSTRACT

A method is described for manufacturing a ceramic composite structure. The method includes wrapping ceramic fibers (22), such as SiC fibers, about the external surface of at least one form. The method further includes heating the wrapped fibers (22) to a temperature no greater than a first temperature, infiltrating voids (24) in the wrapped fibers (22) with the ceramic composite in a first vessel (12) at the first temperature, transferring the infiltrated wrapped fibers (22) from the first vessel (12) to a second vessel (14), distinct from the first vessel (12), and coating the infiltrated wrapped fibers (22) with the ceramic composite in the second vessel (14) at a second temperature, higher than the first temperature.

18 Claims, 2 Drawing Sheets

(51) Int. Cl.
*C04B 35/565* (2006.01)
*C04B 35/80* (2006.01)
*C04B 35/628* (2006.01)
*C23C 16/04* (2006.01)

(52) U.S. Cl.
CPC .... *C04B 2237/365* (2013.01); *C04B 2237/38* (2013.01); *C04B 2237/765* (2013.01)

(56) References Cited

U.S. PATENT DOCUMENTS

| | | | |
|---|---|---|---|
| 5,075,075 A | | 12/1991 | Kapil |
| 5,182,077 A | | 1/1993 | Feinroth |
| 5,330,849 A | * | 7/1994 | Kennedy ................ B32B 18/00 |
| | | | 252/389.31 |
| 5,338,576 A | | 8/1994 | Hanzawa et al. |
| 5,348,774 A | * | 9/1994 | Golecki ................ C04B 35/521 |
| | | | 177/245 |
| 5,350,545 A | | 9/1994 | Streckert et al. |
| 5,391,428 A | | 2/1995 | Zender |
| 5,609,912 A | * | 3/1997 | Lackey ................ C04B 30/02 |
| | | | 427/212 |
| 5,681,511 A | * | 10/1997 | Streckert ................ C04B 35/571 |
| | | | 264/29.7 |
| 5,945,166 A | | 8/1999 | Singh et al. |
| 6,246,740 B1 | | 6/2001 | Maruyama et al. |
| 7,139,360 B2 | | 11/2006 | Lahoda |
| 2004/0253377 A1 | * | 12/2004 | Bok ................ C23C 16/045 |
| | | | 427/249.2 |
| 2006/0039524 A1 | * | 2/2006 | Feinroth ................ C04B 35/806 |
| | | | 376/409 |
| 2007/0099527 A1 | * | 5/2007 | Brun ................ C04B 35/62868 |
| | | | 442/185 |
| 2007/0189952 A1 | | 8/2007 | Easler et al. |
| 2009/0032178 A1 | | 2/2009 | Feinroth |
| 2011/0171399 A1 | * | 7/2011 | Brun ................ C04B 35/62868 |
| | | | 427/543 |
| 2012/0087457 A1 | | 4/2012 | Garnier et al. |
| 2015/0078505 A1 | | 3/2015 | Xu et al. |
| 2016/0049211 A1 | | 2/2016 | Feinroth |
| 2016/0229758 A1 | * | 8/2016 | Kmetz ................ C04B 41/0018 |

OTHER PUBLICATIONS

Y. Katoh et al.; Continuous SiC fiber, CVI SiC matrix composites for nuclear applications: Properties and irradiation effects; Journal of Nuclear Materials, vol. 448 pp. 448-476 (2014).

R. Naslain; Two-dimensional SiC/SiC composites processed according to the isobaric-isothermal chemical vapor infiltration gas phase route; Journal of Alloys and Compounds; vol. 188 (1992) pp. 42-48.

J.R. Creighton et al.; Introduction to Chemical Vapor Deposition (CVD) Sandia National Laboratories; 2001 ASM International, Ohio, USA.

D. Kopeliovich; Fabrication of Ceramic Matrix Composites by Chemical Vapor Infiltration (CVI); SubsTech; http://www.substech.com/dokuwiki/doku.php?id=fabrication_of_ceramic_matrix_composition Aug. 4, 2016.

Chemical Vapor Deposition (CVD) & Chemical Vapor Infiltration (CVI); Thermal Technology LLC; Press Release—Sep. 1999; http://www.thermaltechnology.com/show-all.html?id=28.

International Search Report and Written Opinion of the International Searching Authority for PCT/US2017/047263 dated Dec. 8, 2017 (Forms PCT/ISA/220, PCT/ISA/210, PCT/ISA/237).

* cited by examiner

PROCESS FOR MANUFACTURING SIC COMPOSITE CERAMICS

STATEMENT REGARDING GOVERNMENT RIGHTS

This invention was made with government support under Contract No. DE-NE0008222 awarded by the Department of Energy. The U.S. Government has certain rights in this invention.

BACKGROUND OF THE INVENTION

1. Field of the Invention

The invention relates to the manufacture of SiC composite materials, and more specifically to methods of manufacturing SiC composite fuel rods.

2. Description of the Prior Art

In a typical nuclear reactor, the reactor core includes a large number of fuel assemblies, each of which is composed of a plurality of elongated fuel rods or similar elements that house the fuel fissile material. Fuel rods are encased in a cladding that acts as a containment for the fissile material. Exemplary cladding materials include, for example, zirconium alloy and ceramic composite materials. Exemplary Zr alloys are disclosed in U.S. Pat. Nos. 3,427,222; 5,075,075; and 7,139,360.

Because fuel rods in an accident function in high temperature steam environments, the cladding is subject to corrosive forces. As a remedy, fuel rod cladding has been coated to prevent exterior corrosion. Ceramic-containing coating materials, such as silicon carbide (SiC), have been shown to have desirable safety properties. Experimental ceramic type materials such as SiC monolith, fibers and their combinations are taught in U.S. Pat. Nos. 6,246,740; 5,391,428; 5,338,576; 5,182,077, and U.S. Patent Application Publications 2006/0039524, 2007/0189952; and 2015/0078505, the relevant portions of which are incorporated herein by reference.

SiC composites are frequently in the form of wrappings or braidings of SiC fibers over a mandrel or SiC tube to form the fuel rod cladding. The SiC fiber wrappings or braids are then infiltrated with SiC particles to fill voids in and between the fibers and then infiltrated with SiC using chemical vapor infiltration (CVI). Alternatively, infiltration, can be done exclusively using a low temperature set of conditions, such as those in CVI. Infiltration of the windings may be followed by coating the infiltrated fibers to form a barrier coat using a higher temperature process such as chemical vapor deposition (CVD). To avoid excess handling and to reduce costs and manufacturing time, the two processes, CVI and CVD, are usually carried out sequentially in a single vessel or apparatus. However, it has been found, that during the time that the temperature is changing from the lower temperature CVI process to the higher temperature CVD process, amorphous materials deposit in and around the SiC fibers, which is not optimal for either of the CVI or CVD processes.

SUMMARY OF THE INVENTION

The problems experienced with the conventional method of performing both CVI and CVD operations in the same vessel are addressed by the improved method described herein. As described more fully herein, the method separates the infiltration and coating processes. Infiltration is carried out in a first vessel at a first temperature and coating is carried out in a second vessel at a second temperature, higher than the first temperature.

A method is described herein for manufacturing a ceramic composite structure. The method in various aspects comprises wrapping ceramic composite fibers, by for example, braiding or winding, about the external surface of at least one form, the wrapped fibers defining voids among the wrapped fibers. The method further includes heating the wrapped fibers to a temperature no greater than a first temperature, infiltrating the voids in the wrapped fibers with the ceramic composite in a first vessel at the first temperature, transferring the infiltrated wrapped fibers from the first vessel to a second vessel, distinct from the first vessel, and coating the infiltrated wrapped fibers with the ceramic composite in the second vessel at a second temperature, higher than the first temperature. In various aspects, the method may further comprise applying an interface coating, such as carbon or boron nitride, to the heated wrapped fiber in a separate vessel before infiltrating the voids in the wrapped fibers with the ceramic composite.

The form about which the fibers are wrapped may form an integral, part of the composite structure, and as such, is preferably made of a ceramic composite, such as SiC. The form, in various aspects may alternatively be a removable form, made for example of graphite. The removable form may be removed at any stage in the method where the fibers are sturdy enough to continue the process without the need for the structural support provided by the form. For example, the form may be removed before or after the infiltration step, or after the coating step.

The infiltrating step may comprise injecting a first precursor gas carried in a first carrier gas into the first vessel and flowing the precursor and carrier gases over the heated wrapped fibers. The first precursor gas deposits a ceramic infiltrate, preferably SiC, throughout the voids in the wrapped fibers. The infiltrating step may be a chemical vapor infiltration process, an electrophoretic deposition process, or a combination thereof. The first temperature may be between 800° C. and 1300° C.

Prior to the coating step, in various aspects of the method, the infiltrated wrapped fibers may be heated to a temperature higher than the first temperature up to the second temperature. In various aspects, the coating step may comprise cooling the walls of the second vessel, flowing a second precursor gas and a second carrier gas, each preferably at the second temperature, over the infiltrated wrapped fibers to deposit a dense crystalline coating thereon to form a coated ceramic composite structure. The second precursor gas deposits a ceramic coating, preferably SiC, over the infiltrated wrapped fibers. The coating step may be a chemical vapor deposition process. The second temperature, in various aspect of the method, may be between 1200° C. and 1800° C.

The ceramic composite structure produced by the method, in various aspects, may be used as a nuclear fuel rod formed from SiC fiber wrappings uniformly infiltrated with SiC and having a dense crystalline SiC coating over the outer surface thereof.

BRIEF DESCRIPTION OF THE DRAWINGS

The characteristics and advantages of the present disclosure may be better understood by reference to the accompanying figures.

DESCRIPTION OF THE PREFERRED EMBODIMENTS

As used herein, the singular form of "a", "an", and "the" include the plural references unless the context clearly dictates otherwise. Thus, the articles "a" and "an" are used herein to refer to one or to more than one (i.e., to at least one) of the grammatical object of the article. By way of example, "an element" means one element or more than one element.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Further, any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

The term "ceramic composite" as used herein refers to various ceramic composite materials, such as silicon carbide (SiC) and SiC fibers.

The term "void" or "voids", "pore" or "pores" or "interstices" of the fiber wrappings refer to the open or unoccupied areas within and between the fibers and fiber tows and the fiber wrappings. The voids will necessarily be inconsistent in shape and size and will have for the most part, irregular shapes.

An improved method for manufacturing fuel rods for nuclear power plants is provided herein. The ceramic composite fuel rods formed by the improved method are believed to meet the corrosion resistance requirements of nuclear power facilities during both normal operation and transients and beyond design basis accidents.

Figure 1A:
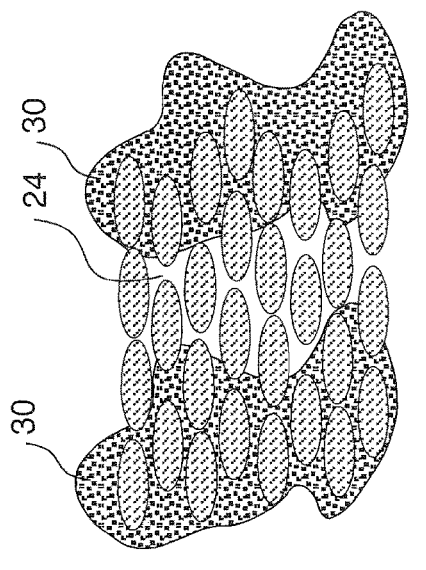
FIGS. 1A-C illustrate a partial cross-section of fiber wrappings (A) before CVI infiltration of particles showing the voids between the fibers; (B) after an idealized CVI infiltration of particles; and (C) after an actual prior art CVI infiltration, showing the remaining voids between fiber wrappings due to blocked pores.
Figure 1B:
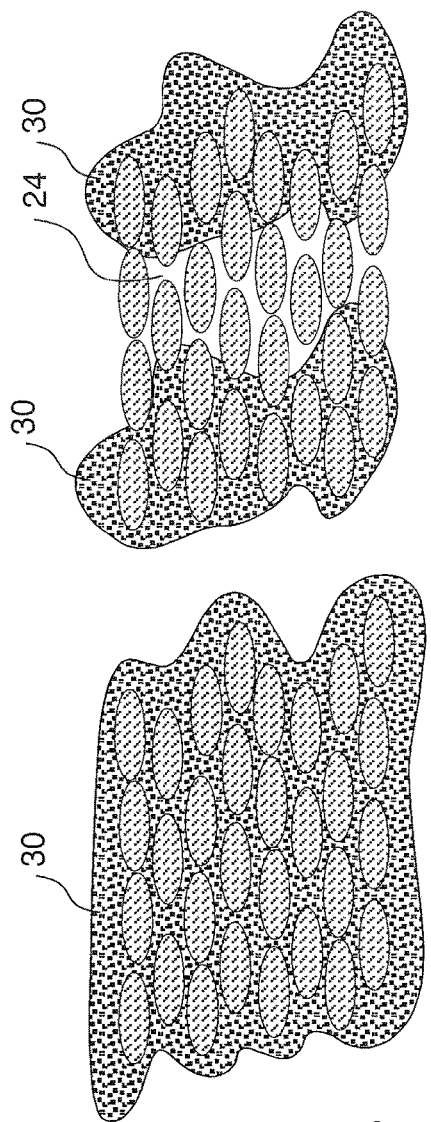
Figure 1C:
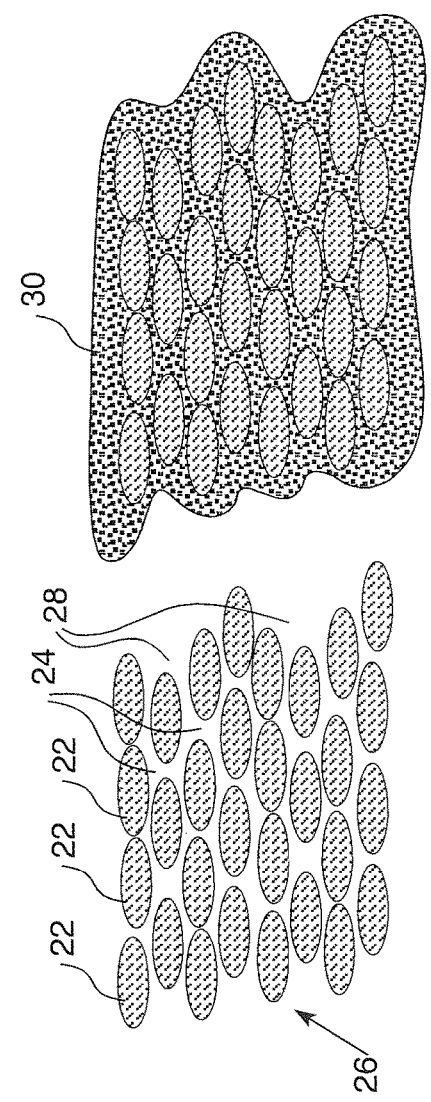

FIG. 1 illustrates one example of the problems experienced with prior manufacturing methods. FIG. 1A illustrates a cross-sectional view of fibers 22 wrapped around the exterior 28 of a substrate (not shown) before any attempt to fill the voids 24 present between the fiber wrappings 22. To form a high strength ceramic composite, the voids 24 in the fiber wrappings 22 used to cover a substrate surface must be filled with a compatible material. When the fibers 22 are made of a ceramic, the material used to infiltrate the voids is preferably the same ceramic. In various embodiments, the ceramic used for both the fibers and the infiltrate is SiC. The goal in using a ceramic composite to fill the voids 24 is to produce a high density composite infiltrate 30, such as that shown by the desired structure in FIG. 1B, that substantially completely, and preferably completely, fills the voids 24. In prior practices, however, as shown in FIG. 1C, the initial deposits of the infiltrate material formed at the lower temperatures typical of chemical vapor infiltration (CVI) processing act to block further infiltration of the precursor gases that form the infiltrate. Under these circumstances, the precursor gases do not reach the interior of the fiber wrappings 22, so either the voids 24 remain unfilled or amorphous materials form during the CVI process, rendering the substrate less resistant to corrosion.

To combat that problem, a coating 34, also preferably made of a ceramic composite, and more preferably made of SiC, is applied to the fiber wrappings 22 and infiltrate 30, but experience has shown that formation of a good barrier depends on forming the barrier at higher temperatures. Unfortunately, deposits formed at higher temperatures, such as the temperatures typical of chemical vapor deposition (CVD) processes, result in the undesirable formation of deposits on the vessel walls in which the CVD process is carried out with minimal penetration into the composite layers formed on the fiber wrappings 22 and infiltrate 30.

An improved method for filling the voids 24 of ceramic composite wrappings 22 around a form and of forming a barrier layer on the infiltrated fibers are described herein. The form may take any shape. In various aspects, the form may be a tube determined to have physical properties appropriate for use in the environments in which the end product will be used. For example, the tube may be a SiC tube. The tube provides an internal hermetic seal for the composite structure. Alternatively, the form may be any suitable removable form for holding the fibers 22 in place during the infiltration step which stiffens and strengthens the wound fibrous structure and during the coating step which adds a barrier against corrosion, so that the coated, infiltrated composite structure is itself able to function as the tubing without the need for a separate internal tube. The form may be made of graphite or a similar material that can withstand the heat in the infiltration and coating steps. Following the coating process, the form is removed, leaving an open interior. The solid ceramic composite tubing may be used as a nuclear fuel rod to hold the nuclear fissile material. Those skilled in the art will appreciate that the "tube" may be circular or non-circular in cross-section and as such, the term "tube" should not be construed as limited to a cylinder.

To begin the process, a form or tube of a desired shape is wrapped with ceramic fiber tows 22 by braiding or by winding the fiber tows about the outer surface of the form or tube. Braiding and winding techniques are well known to those skilled in this area of endeavor. The fiber, in various aspects, may be a ceramic fiber or a ceramic composite fiber, such as SiC, and preferably, is a SiC ceramic with low oxygen and a near stoichiometric ratio of Si/C. The SiC composite formed on the outside of the tube may comprise continuous SiC fiber-reinforced SiC matrix composites, as disclosed in U.S. Patent Application Publication 2015/0078505 or Y. Katoh et al., "Continuous SiC fiber, CVI SiC matrix composites for nuclear applications: Properties and irradiation effects," *Journal of Nuclear Materials*, vol. 448, pp. 448-476 (2014). The type of SiC fibers that may be used in the method described herein may, for example, be either Hi-Nicalon™ Type S fibers (manufactured by Nippon Carbon, Tokyo, Japan) or Tyranno™ SA3 fibers (manufactured by Ube Industry, Ube, Japan) listed in Table 1 of Y. Katoh et al., *Journal of Nuclear Materials*, vol. 448 at 450.

The method of manufacture described herein produces in various embodiments, multiple layers of SiC materials, including dense monolithic SiC, SiC—SiC composite, SiC fiber reinforced composites, such as one or more, preferably two or three, layers of high purity beta or alpha phase stoichiometric SiC covered by a central layer of continuous beta phase stoichiometric SiC fibers infiltrated with beta phase SiC and an outer protective layer of fine grained, highly crystalline beta phase SiC. In various aspects, the finished product may include a SiC continuous fiber-reinforced, SiC matrix composites (SiC/SiC composites) consisting of near stoichiometric SiC fibers, stoichiometric and fully crystalline SiC matrices, and pyrocarbon or multilayered pyrocarbon/SiC interphase between the fiber and the matrix.

The wrappings, whether by braiding or winding, may have a thickness comparable to the thickness of the tube or form being wrapped. In exemplary embodiments, the wrappings may be from 0.1 to 2 mm thick. In certain embodiments, SiC fiber tows may be wrapped to a thickness of about 0.1 mm to 2 mm and preferably wrapped to a thickness of about 0.4 mm to 1 mm. The wrappings about the form or tube generally have a density of about 45-55%, so are inherently porous, forming the voids 24.

Following wrapping the fibers around the tube or form, the method further includes infiltration and coatings steps. The improved method separates the infiltration process from the coating process by carrying out each process in a separate chamber or vessel at different temperatures. Infiltration is carried out in a first vessel (12) at a first temperature and coating is carried out in a second vessel (14) at a second temperature, higher than the first temperature. The first and second temperatures are reached by any suitable means, and may be by the same method or different heating methods. The first and second vessels (12/14) may be distinct vessels, separate from each other, or may be distinct chambers in a larger apparatus, but are still separated from each other such that the conditions present in one chamber do not affect the conditions present in the other chamber. Such conditions may include, for example, one or more of chamber or vessel wall temperature, air temperature, pressure, gas flow, and the kind and relative concentration of reactants.

In the infiltration stage of the method, after the tube or form is wrapped with the fibers 22, the voids 24 remaining in the interstices of the fiber wrappings are filled according to various aspects of the improved method, by a suitable infiltration technique, such as chemical vapor infiltration (CVI) or electrophoretic deposition alone or in combination with CVI.

The improved method includes, in various aspects, heating the fibrous material 22 to a temperature no greater than the temperature to be used in the infiltration process. The fibrous material 22 may be uniformly heated or, may preferably be heated to a higher temperature in the interior of the wrappings than at the outer surface of the wrappings. In various aspects, the higher temperature in the interior of the wrappings is no greater than the temperature to be used in the infiltration process.

The fibrous material 22 may be heated in various ways. For example, the fibrous material 22 may be heated by heating the vessel 12 (i.e., the vessel walls and the air contained therein) to a temperature close to (for example, within about 25° C.) the temperature desired for the formation of the infiltration deposits. Alternatively, the vessel walls may not be actively heated and the fibrous material 22 may be heated instead by heating the precursor gases that infiltrate the fibrous material 22 and the voids 24.

Figure 2A:
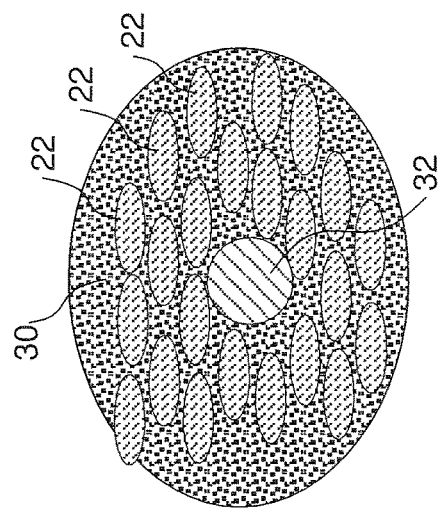
FIGS. 2A-C illustrate a partial cross-section of fiber wrappings of one embodiment of the method described herein (A) before CVI infiltration of particles showing the voids between the fibers and a cross-section of an inner heating rod; (B) partially processed fiber wrappings with a partial CVI deposit of particles in the voids between fibers; and (C) the final CVI infiltration of particles showing the voids fully infiltrated.
Figure 2B:
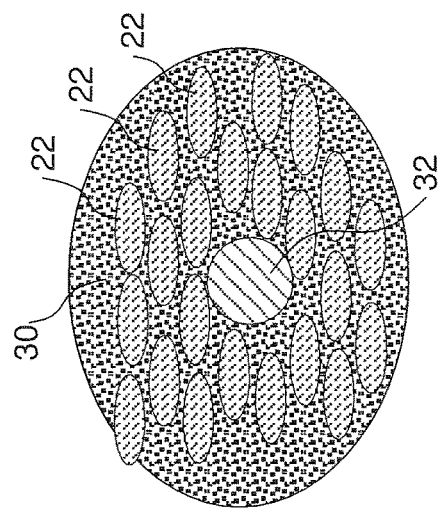
Figure 2C:
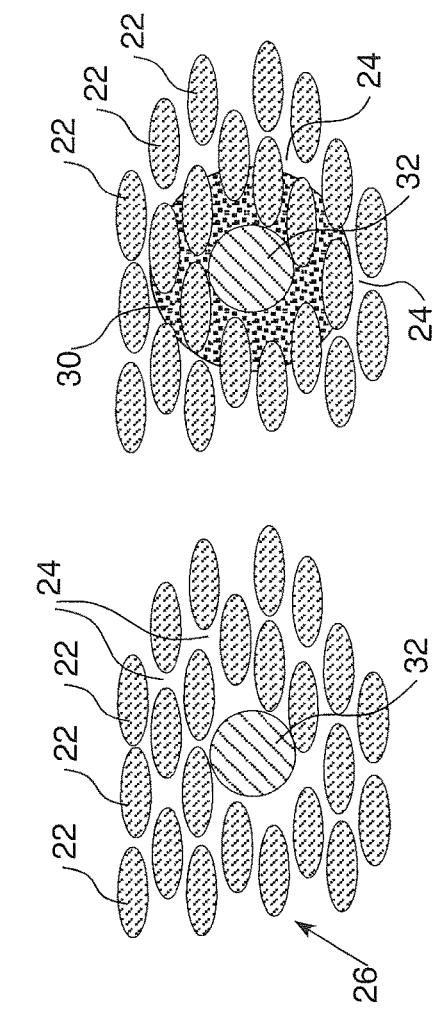

Other suitable means for heating the fibrous material 22 include, but are not limited to, induction heating, microwave heating or, as shown in FIG. 2, heating with an internal heating element 32, such as a heated mandrel, positioned in the interior of the fiber wrappings and placed into the infiltration vessel 12. In various aspects, if a SiC tube is used instead of a removable form, current may be applied to the SiC tube to heat it to provide the higher temperatures in the interior portion of the fiber wrappings 22. The SiC tube is more dense than a graphite mandrel, so will hold more heat. The heater 32, regardless of which heater is used, may be heated to a temperature that heats the inner fibers 22 surrounding the heater 32 to a higher temperature than the temperature of the fibers near the outer side 26 of the fiber wrappings 22. The resulting composite structure will have a higher density since the deposits, as shown in FIG. 2B, tend to form on the wrappings that are the hottest, in this case, those closer to the heater 32, and tend to form more slowly on the outer side of the wrappings where the temperature is relatively cooler. As the infiltration process continues, the deposition of the infiltrate 30 continues to the outer surface 26 of the fiber wrappings 22. The temperature differential and the resulting density of deposit formation near the center of the fiber wrappings reduces the blocking of the void areas 24 that interfered with the infiltrate deposition in conventional infiltration processes.

The heater 32 may itself be heated by any suitable means, such as by electric resistance heating carried through the heater.

Figure 3A:
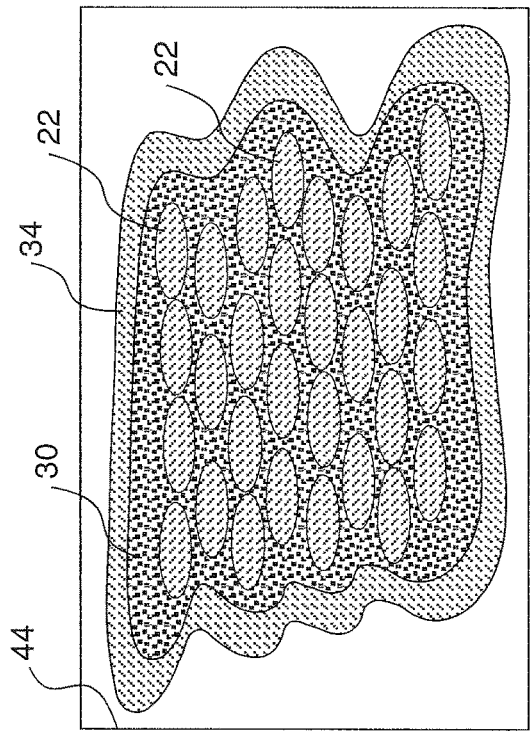
FIGS. 3A-B illustrate a partial cross-section of fiber wrappings of one embodiment of the method described herein (A) following CVI infiltration but before application of a CVD process to coat the infiltrated fiber wrappings; and (B) after CVD processing showing the final CVD deposit.
Figure 3B:
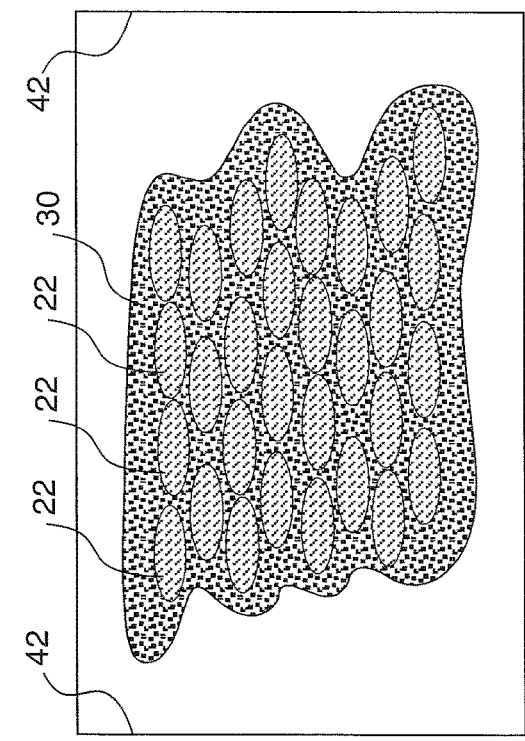

Referring to FIG. 3, the infiltration process may be carried out in a first vessel 12 (FIG. 3A) with a uniformly heated fiber composite and the coating process may be carried out in a second vessel 14 (FIG. 3B). The infiltration process, in various aspects, may be a CVI process carried out at temperatures ranging from 800° C. to 1300° C., and preferably between 1000° C. and 1200° C. In this temperature range, precursor gases diffuse into the voids 24 formed in the fiber wrappings 22. The gas or gases may be heated to the desired temperature of 800-1300° C., or the air in the chamber may be heated to the desired temperature, or a combination of both means of heating may be used to bring the temperature in this process step to the desired temperature.

CVI provides a process for depositing chemical vapors of a desired material or a precursor to a desired material, or particles of a desired material or a precursor thereof that are carried by a vapor, onto the internal surfaces of a porous preformed structure, in the present case, the fiber wrappings 22. Reactants are introduced into the voids 24 of the porous preformed fiber wrappings 22 by diffusion or by force using convection. As precursor gases diffuse into the fiber matrix, there is a continuous decomposition of the precursor gases taking place on the fibers surfaces to form the deposited infiltrate 30. As the infiltration proceeds, the infiltrate thickens, filling the voids 24 and bonding to the fiber wrappings 22. One commercially useful CVI processes uses a reduced pressure of about 1 to 10 kPa for deposition of the infiltrate by diffusion. An advantage to processing under a lower pressure is to allow the gases to slowly infiltrate the fiber voids before deposition of the SiC infiltrate takes place. Another useful CVI process is a forced flow thermal gradient technique that is significantly (hours versus days) more rapid than the diffusion processes. Those skilled in the art will recognize that the temperature and pressure may be adjusted to reach a desired rate of infiltration, density of the infiltrate, and a desired overall processing time.

The precursor gases may, for example, be methyltrichlorosilane carried in hydrogen to yield silicon carbide deposits on and between the fibers, while releasing hydrogen chloride and hydrogen gases, represented by the equation:

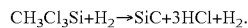

$$CH_3Cl_3Si+H_2 \rightarrow SiC+3HCl+H_2.$$

Other precursors of other ceramic composites, and preferably, other precursors of SiC, may be used as the gas that, upon contact with the fiber wrappings 22 at the infiltration temperatures, deposits the infiltrate into the voids 24.

The coating process following the infiltration process is carried out in a second, separate vessel 14 with a uniformly heated composite structure, heated to a second, higher temperature than the first temperature used during infiltration. In various aspects of the method, the coating process proceeds under higher pressure conditions than used in the infiltration step. The composite structure, which is comprised of the fiber wrappings 22 infiltrated with the infiltrate 30, may be heated to a higher temperature than the surrounding vessel 14 to encourage deposition on the outer surfaces of the composite structure of a highly dense and crystalline coating layer 34. The walls 44 of vessel 14 may be cooled to minimize deposition on the vessel 14 itself. The temperature in a typical coating process, such as a CVD process, is higher than the temperature of the infiltration process, and may be, for example, from 1200° C. to 1800° C. and preferably from 1300° C. to 1500° C. In this temperature range, very crystalline (<10% amorphous), very dense (>95% theoretical density) SiC is formed which has a high resistance to environmental conditions. In order to avoid excessive deposition on the vessel 14, the vessel walls 44 may be cooled to a temperature lower than the temperature of the composite structure, while the composite structure is heated to the required processing temperature by suitable means, such as microwave or induction heating.

The heating methods used in the infiltration and coating portions of the method are preferably different, but may be the same, provide the coating temperature is higher than the infiltration temperature. For example, in the infiltration process, the heating method may be resistance heating of the central core of the structure, whereas in the coating process, the heating method may be microwave heating that preferentially heats the outer surface of the composite structure. Alternatively, the heating method in the infiltration process may be induction heating and the heating method in the coating process may be microwave heating. In yet another alternative aspect, the infiltration and coating heating processes may be resistance and induction, respectively, or may be the same.

CVD is a materials process that has been in wide commercial use to deposit a wide range of materials. CVD, in general, involves flowing a precursor gas or gases into a chamber containing the heated object to be coated. In various aspects of the method described herein, the object is the highest density of infiltrated fiber wrappings 22 resulting from the infiltration process described above. The fiber wrappings 22 may have been separated from the removable form prior to the coating step, or may be still be wrapped about the form or the tube. Chemical reactions on or near the surface of the heated object create a film on the surface, coating the object. The precursor gas may be the same gas used in the CVI step, i.e., methyltrichlorosilane carried in hydrogen or other precursors the SiC.

In various alternative aspects, the method may further include applying an interface coating to the heated wrapped fiber in a separate vessel before transfer of the wrapped fibers to the first vessel for infiltrating the voids in the wrapped fibers with the ceramic composite. The interface coating may be carbon or boron nitride, and preferably with $^{11}B$. The heated fibers are preferably transferred to a separate vessel after heating where an interface gas decomposes to deposit the interface coating on the fibers. Thereafter, the fibers are transferred to the first vessel for the infiltration process, maintaining the temperature from the heating step.

Figure 4:
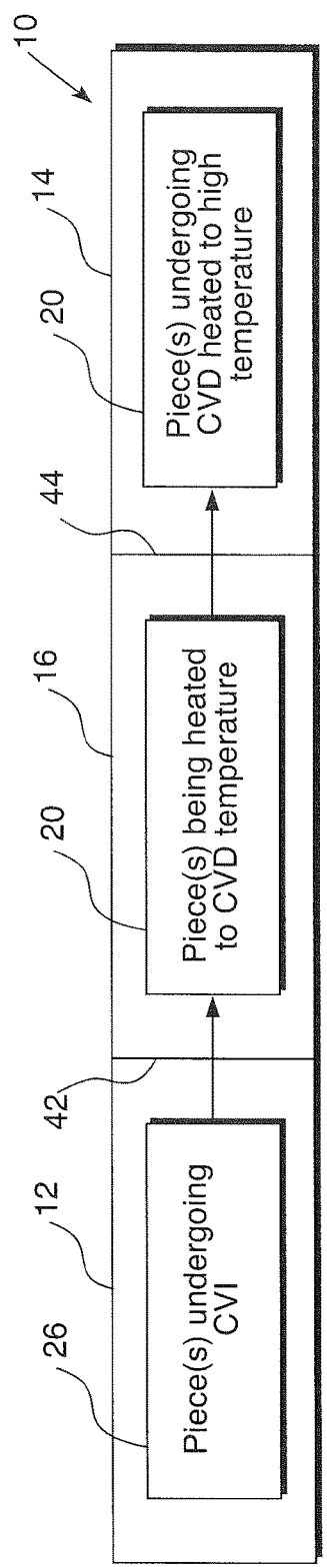
FIG. 4 is a schematic illustration of the an embodiment of the processing sequence of the method described herein showing a distinct CVI chamber separated from a distinct CVD chamber by an optional interface chamber connecting the CVI and CVD chambers.

The method may be carried out in a system 10, shown in FIG. 4, to accommodate maximum process throughput. In various aspects, separate vessels 12 and 14 or separated chambers 12/14 in a single apparatus, may be sized to accommodate single or multiple fiber 22 wrapped structures 20 simultaneously in batch processing. In various aspects, vessel 12 has walls 42 and includes the equipment (not shown) used for carrying out the infiltration process for filling the voids 24 in the fiber wrappings 22 with the infiltrate 30 to form the composite structure. Such equipment is commercially available and well known to those skilled in the art and, as such, need not be detailed herein. In various aspects, vessel 14 has walls 44 and includes the equipment (not shown) used for carrying out the chemical vapor deposition process to coat the composite structure following deposition of the infiltrate 30 into the voids 24 of the fiber wrappings 22. Such equipment is commercially available and well known to those skilled in the art and, as such, need not be detailed herein. While single vessel application of CVI and CVD might utilize large fixtures to hold a large number of tubes (>20) so as to achieve a reasonable output, the multiple vessel approach might utilize fixtures holding a small number of tubes (<20). These fixtures would be mounted on a device either on rollers or not, but pushed or dragged through the multiple chambers to advance the work pieces form the CVI to the CVD process. The smaller number of tubes allows for more uniform temperatures to be achieved among the tubes and allows the use of innovative hating methods such as internal resistance heaters that would not be practical for very large numbers of tubes.

The heating process in vessels 12 and 14 may be applied to the wrapped structures 20, as described above, or may be moved along the wrapped structures 20, or applied to the vessels 12/14 or to the carrier gas as described above. For instance, an induction heater could be moved along the outside of the structure holding the tubes using a trolley or screw driven device which then reverts back quickly to the entrance of the chamber after completing its scan of the tubes while the tubes are being indexed to the next chamber.

In an alternative system or apparatus 10, an intermediate vessel or interface chamber 16 may be incorporated between the first and second chambers 12/14 to provide for increased production rates by allowing the structures 20 to be pre-heated as they move from the first chamber 12 before entering the second chamber 14. Multiple interface chambers or vessels may be used at appropriate intervals in the process, for example, any combination of one or more of the following additional distinct chambers may be used: a vessel or chamber in advance of the infiltration vessel 12 to preheat the fiber wrappings 22 to at or near the first temperature range before entering the first chamber 12 for the infiltration process, a vessel or chamber between the heating vessel and the infiltration vessel 12 to apply the interface coating to the heated wrapped fibers, a vessel or chamber in between the infiltration and coating vessels to pre-heat the composite structure to at or near the second higher temperature range before entering the second chamber 14 for application of the coating process, and a vessel or chamber positioned after the coating process to actively or passively cool the coated composite structure.

In various aspects, the vessels or chambers 12/14 may be hot walled or cold walled reactors with inlets for the gaseous precursors and outlets for the by-products of the infiltration or coating processes. In a typical hot walled reactor, the walls are surrounded by a furnace or other heat source that heats the vessel interior to a desired temperature prior to introduction of the precursor gas or gases. In a typical cold walled reactor, the vessel may be surrounded by water-cooled walls. In each case, there is a gas inlet for introduction of the precursor gases, and an exhaust outlet.

The forms or tubes about which the fibers 22 are wrapped may be positioned vertically or horizontally on a conveyer or in trolleys, sleds, or holders of any desirable sort to move one or multiple products through the vessels 12 and 14 and any preliminary, intermediate, or post processing vessels used in the manufacture of the finished ceramic composite tubes.

The coating applied to the composite structure is highly crystalline and resistant to corrosion, providing a strong barrier against the harsh environment in, for example, a nuclear reactor.

The process described herein results in a cladding that is superior to claddings produced in a batch process carried out in a single vessel or chamber. The infiltrate is dense and uniformly distributed through the fiber wrappings and the coating forms a stronger barrier with higher resistance to external environmental conditions, such as moisture penetration that would, in the absence of the strong coating, lead to corrosion of the underlying structure.

All patents, patent applications, publications, or other disclosure material mentioned herein, are hereby incorporated by reference in their entirety, except that all references, and any material, or portion thereof, that are said to be incorporated by reference herein are incorporated herein only to the extent that the incorporated material does not conflict with existing definitions, statements, or other disclosure material expressly set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the art will recognize, or be able to ascertain using no more than routine experimentation, many equivalents to the various embodiments of the invention described herein upon review of this specification. Thus, the invention is not limited by the description of the various embodiments, but rather by the claims.

What is claimed is:

1. A method of manufacturing a ceramic composite structure for use as cladding for a nuclear fuel rod consisting essentially of:

providing a tube of crystalline silicon carbide fibers having an inner portion, an outer portion, and voids defined among the fibers;

optionally applying an interface coating to the tube of silicon carbide fibers in a separate vessel;

heating the tube of crystalline silicon carbide fibers to a temperature no greater than a first temperature between 800° C. and 1300° C. by one of: (i) placing the wrapped fibers in a heated vessel, (ii) flowing gases heated to the first temperature over the wrapped fibers, or (iii) inserting a heating element within the wrapped fiber and heating the inner portion of the wrapped fibers to a temperature higher than the temperature of the outer portion of the wrapped fibers;

in a first vessel, uniformly infiltrating the voids in the fibers with a crystalline silicon carbide deposit at the first temperature and at a first pressure by one or a combination of a chemical vapor infiltration process and an electrophoretic deposition process;

transferring the uniformly infiltrated fibers from the first vessel to a second vessel, separate and distinct from the first vessel, wherein the first and second vessels are separated from each other such that the conditions in each vessel do not affect the conditions in the other vessel; and, in the separate and distinct second vessel, coating the infiltrated fibers with the silicon carbide composite to form a corrosion resistant dense crystalline outer barrier coating having less than ten percent amorphous material and greater than ninety-five percent theoretical density to form a coated crystalline silicon carbide composite structure;

wherein coating is carried out by a chemical vapor deposition process at a second temperature between 1200° C. and 1800° C. and at a second pressure by flowing a coating step precursor gas and a coating step carrier gas over the infiltrated fibers, wherein the second temperature is higher than the first temperature and the second pressure is higher than the first pressure, and wherein prior to coating the infiltrated fibers, uniformly heating the infiltrated fibers to a temperature higher than the first temperature up to the second temperature.

2. The method recited in claim 1 wherein prior to the infiltration step, the fibers are heated to within 25° C. of the first temperature.

3. The method recited in claim 1 wherein the tube of crystalline silicon carbide fibers are formed by wrapping crystalline silicon carbide fibers about the external surface of at least one form and,
heating the form about which the fibers are wrapped.

4. The method recited in claim 3 wherein the at least one form is heated to raise the temperature of the inner portion of the wrapped fibers to a temperature higher than the temperature of the outer portion of the wrapped fibers.

5. The method recited in claim 3 wherein the wrapping step is selected from braiding and winding the ceramic fibers around the form.

6. The method recited in claim 5 wherein the form is a removable form removed after the infiltration step.

7. The method recited in claim 5 wherein the form is a SiC tube that hermetically seals the inner portion of the wrapped fibers.

8. The method recited in claim 1 wherein the infiltrating step comprises injecting an infiltrating step precursor gas carried in an infiltrating step carrier gas into the first vessel and flowing the infiltrating step precursor and carrier gases over the heated fibers.

9. The method recited in claim 8 wherein the infiltrating step precursor gas is methyltrichlorosilane and the infiltrating step carrier gas is hydrogen.

10. The method recited in claim 1 wherein the first temperature is between 1000° C. and 1200° C.

11. The method recited in claim 1 wherein the step of applying an interface coating in a separate vessel before the infiltrating step is not optional.

12. The method recited in claim 1 wherein transferring the infiltrated fibers to the second vessel comprises transfer to an intermediate vessel.

13. The method recited in claim 12 wherein the infiltrated fibers are heated in the intermediate vessel to a temperature higher than the first temperature up to the second temperature.

14. The method recited in claim 1 wherein the coating step precursor gas is methyltrichlorosilane and the coating step carrier gas is hydrogen.

15. The method recited in claim 1 wherein the coated composite structures are cooled following the coating process.

16. The method recited in claim 1 wherein the second temperature is between 1300° C. and 1500° C.

17. The method recited in claim 1 wherein the method is a batch process comprising a plurality of silicon carbide fiber tubes.

18. A method of manufacturing a ceramic composite structure for use as cladding for a nuclear fuel rod consisting essentially of:
wrapping crystalline silicon carbide fibers about the external surface of at least one form, the wrapped fibers defining voids among the wrapped fibers;
optionally applying an interface coating to the tube of silicon carbide fibers in a separate vessel;
heating the wrapped fibers to a temperature no less than 25° C. below a first temperature between 800° C. and 1300° C. by one of placing the wrapped fibers in a heated vessel, flowing gases heated to the first temperature over the wrapped fibers, or inserting a heating element within the wrapped fiber and heating the inner portion of the wrapped fibers to a temperature higher than the temperature of the outer portion of the wrapped fibers;
in a first vessel, injecting a first precursor gas carried in a first carrier gas at the first temperature and at a first pressure and flowing the precursor and carrier gases over the heated wrapped fibers to infiltrate voids in the wrapped fibers with a crystalline silicon carbide deposit;
cooling the walls of a second vessel, separate and distinct from the first vessel, wherein the first and second vessels are separated from each other such that the conditions in each of the first and second vessels do not affect the conditions in the other of the first and second vessels;
transferring the infiltrated wrapped fibers from the first vessel to the second vessel;
in the separate and distinct second vessel, uniformly heating the infiltrated wrapped fibers to a temperature higher than the first temperature up to a second temperature between 1200° C. and 1800° C.; and,
flowing a second precursor gas and a second carrier gas over the heated crystalline infiltrated wrapped fibers to deposit a corrosion resistant dense crystalline outer barrier coating thereon, the dense crystalline outer barrier coating having less than ten percent amorphous material and greater than ninety-five percent theoretical density to form a coated crystalline silicon carbide composite structure.

* * * * *